United States Patent [19]
Nishi

[11] Patent Number: 5,374,153
[45] Date of Patent: Dec. 20, 1994

[54] TRANSFER APPARATUS

[75] Inventor: Mitsuo Nishi, Kumamoto, Japan

[73] Assignees: Tokyo Electron Limited, Tokyo; Tokyo Electron Kyushu Limited, Kumamoto, both of Japan

[21] Appl. No.: 140,985

[22] Filed: Oct. 25, 1993

Related U.S. Application Data

[63] Continuation of Ser. No. 787,663, Nov. 4, 1991, abandoned.

[30] Foreign Application Priority Data

Nov. 17, 1990 [JP] Japan .................. 2-312478

[51] Int. Cl.⁵ ................................... B65G 65/00
[52] U.S. Cl. .......................... 414/417; 414/938; 414/935; 414/744.2; 414/222; 414/416; 414/404
[58] Field of Search ............. 414/404, 416, 417, 222, 414/217, 935, 937, 938, 940, 941, 744.2, 744.5, 744.3; 118/719, 500; 204/298.25

[56] References Cited

U.S. PATENT DOCUMENTS

| | | | |
|---|---|---|---|
| 4,735,540 | 4/1988 | Allen et al. | 414/416 X |
| 4,806,057 | 2/1989 | Cay et al. | 414/404 X |
| 4,938,655 | 7/1990 | Asano | 414/404 X |
| 4,987,407 | 1/1991 | Lee | 414/404 X |
| 5,007,788 | 4/1991 | Asano et al. | 414/404 X |
| 5,054,988 | 10/1991 | Shiraiwa | 414/404 |
| 5,125,784 | 6/1992 | Asano | 414/404 |

FOREIGN PATENT DOCUMENTS

| | | | |
|---|---|---|---|
| 236714 | 6/1986 | German Dem. Rep. | 414/416 |
| 149152 | 7/1987 | Japan | 414/404 |
| 188335 | 8/1987 | Japan | 414/404 |
| 48442 | 2/1989 | Japan | 414/404 |
| 255242 | 10/1989 | Japan | 414/404 |
| 253639 | 10/1990 | Japan | 414/417 |

*Primary Examiner*—Frank E. Werner
*Attorney, Agent, or Firm*—Oblon, Spivak, McClelland, Maier & Neustadt

[57] ABSTRACT

There is provided a transfer apparatus which is capable of transferring objects on a plurality of carriers at a time to a desired point. This apparatus comprises a carrier table for linearly arranging a plurality of the carriers, a plurality of push-up members for pushing up the objects supported on the carriers, drive devices for moving the push-up members towards or away from each other, and a rotary transfer arm mechanism having a pair of support arms for receiving the objects lifted on the push-up members, and transferring the objects to a desired point.

16 Claims, 10 Drawing Sheets

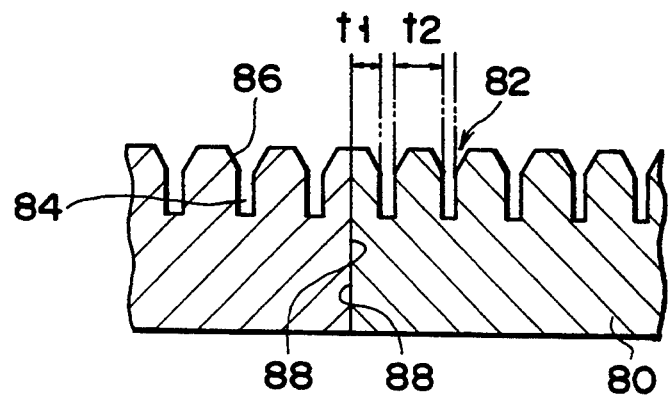
F I G. 5
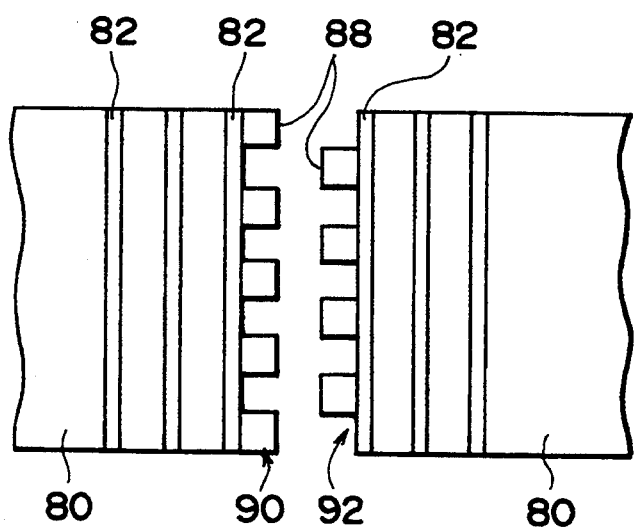
F I G. 6

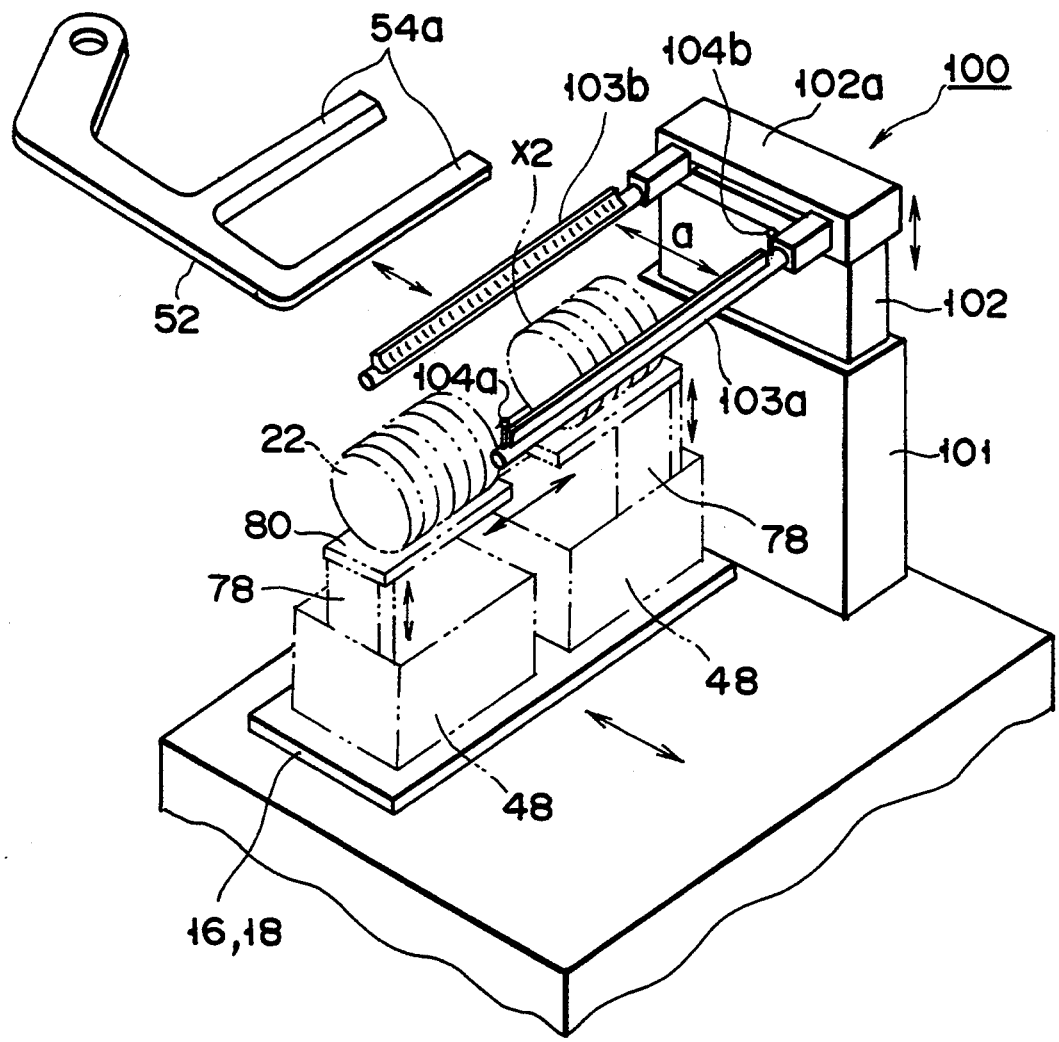
F I G. 12

TRANSFER APPARATUS

This application is a continuation of application Ser. No. 07/787,663, filed on Nov. 4, 1991, now abandoned.

BACKGROUND OF THE INVENTION

1. Field of the Invention

The present invention relates to a transfer apparatus for transferring a number of objects arranged on a carrier onto another support member.

2. Description of the Related Art

Conventionally, a semiconductor wafer transfer apparatus for transferring a number of objects, e.g. semiconductor wafers, onto another support member at a time has been employed in a semiconductor manufacturing apparatus such as a heat treatment apparatus or a washing apparatus.

In this conventional semiconductor wafer transfer apparatus, for example, 25 semiconductor wafers contained in a single carrier are pushed up by a push-up member, and the 25 wafers in the single carrier are chucked by a chuck situated on the upper side. The chucked wafers are transferred.

In the conventional semiconductor wafer transfer apparatus, there is no other choice but to transfer semiconductor wafers in units of, e.g. 25, in each carrier. However, in a heat treatment process, semiconductor wafers of, e.g. four carriers can be batch-treated at a time; in a washing process, wafers of, e.g. two carriers can be batch-treated at a time. Thus, in order to transfer the wafers for a single batch-treatment, it is necessary to repeat the wafer transfer operation a number of times corresponding to the number of carriers containing the wafers to be subjected to the batch-treatment. As a result, the time necessary for the transfer is increased and the treatment throughput is decreased.

SUMMARY OF THE INVENTION

The object of the present invention is to provide a transfer apparatus by which the time for transfer can be reduced.

Specifically, this invention aims at providing a transfer apparatus capable of transferring objects on a plurality of carriers at a time.

This object can be achieved by the transfer apparatus of the present invention described below.

The present invention provides a transfer apparatus for transferring a plurality of objects between a carrier constituted by a frame for supporting the objects equidistantly and another support member, said transfer apparatus comprising:

a carrier table for arranging a plurality of said carriers linearly along the longitudinal axes of said carriers;

a plurality of push-up members for pushing up said objects supported on the carriers through a lower opening portion of each carrier, and supporting the objects at the upper part of each carrier; and drive means for moving the push-up members towards or away from each other, thereby shifting the objects towards or away from each other, wherein all the objects, which have been lifted by the push-up members and approached to one another, are transferred to said other support member at a time.

With the above apparatus, it is desirable that each of said push-up members is designed such that the distance between an adjoining end portion of the push-up member and the endmost object located at said adjoining end portion is half the distance between other adjacent objects.

With the above apparatus, it is desirable that mutually adjoining end portions of the push-up members are provided with ridges and grooves, which are to be intermeshed, and when the ridges and grooves of the adjoining end portions are intermeshed, the distance between the objects situated at the end portions is equal to the distance between other adjacent objects.

The above apparatus may further comprise a rotary transfer arm mechanism having a pair of support arms for supporting and receiving, from the lower side, the objects of the carriers lifted by the push-up members, and transferring the objects to said other support member.

The support arms of the rotary transfer arm mechanism may be movable towards each other or fixed at a predetermined distance.

The present invention further provides a transfer apparatus for transferring a plurality of objects between a carrier constituted by a frame for supporting the objects equidistantly and another support member, said transfer apparatus comprising:

a carrier table for arranging a plurality of said carriers, linearly along the longitudinal axes of said carriers, each carrier being constituted by a frame supporting the objects equidistantly;

a plurality of push-up members for pushing up said objects supported on the carriers, and supporting the objects at the upper part of each carrier; and a rotary transfer arm mechanism having a pair of support arms distanced in parallel, for supporting and receiving, from the lower side, the objects of the carriers lifted by the push-up members, and transferring the objects to said other support member.

The support arms of the rotary transfer arm mechanism may be movable towards each other or fixed at a predetermined distance.

The present invention further provides a transfer apparatus for transferring a plurality of objects between a carrier constituted by a frame for supporting the objects equidistantly and another support member, said transfer apparatus comprising:

a carrier table for arranging a plurality of said carriers, linearly along the longitudinal axes of said carriers, each carrier being constituted by a frame supporting the objects equidistantly;

a plurality of push-up members for pushing up said objects supported on the carriers, and supporting the objects at the upper part of each carrier;

support means provided on one side of the carrier table vertically movably and having at its upper part a pair of support arms distanced in parallel so as to be movable towards each other, thereby receiving and supporting at a time, from the lower side, the objects of said plurality of carriers lifted by said push-up members; and a rotary transfer arm mechanism for receiving the objects of the carriers from said support means and transferring the objects to said other support member.

An optical sensor for detecting the presence of the supported objects may be provided on at least one of the pair of support arms over the area from the distal end to the proximal end of the one support arm.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 5 is a vertical-cross-sectional view showing the state of the push-up members shown in FIG. 4B, which are brought into contact with each other;

FIG. 6 is a plan view showing the state of the mutually adjoining end portions of the push-up members;

FIG. 12 is a perspective view of a semiconductor wafer transfer apparatus according to another embodiment of the invention.

DETAILED DESCRIPTION OF THE PREFERRED EMBODIMENTS

Embodiments of the present invention, in which a transfer apparatus of the invention has been applied to a washing apparatus in a semiconductor wafer manufacturing apparatus, will now be described with reference to the accompanying drawings.

Figure 1:
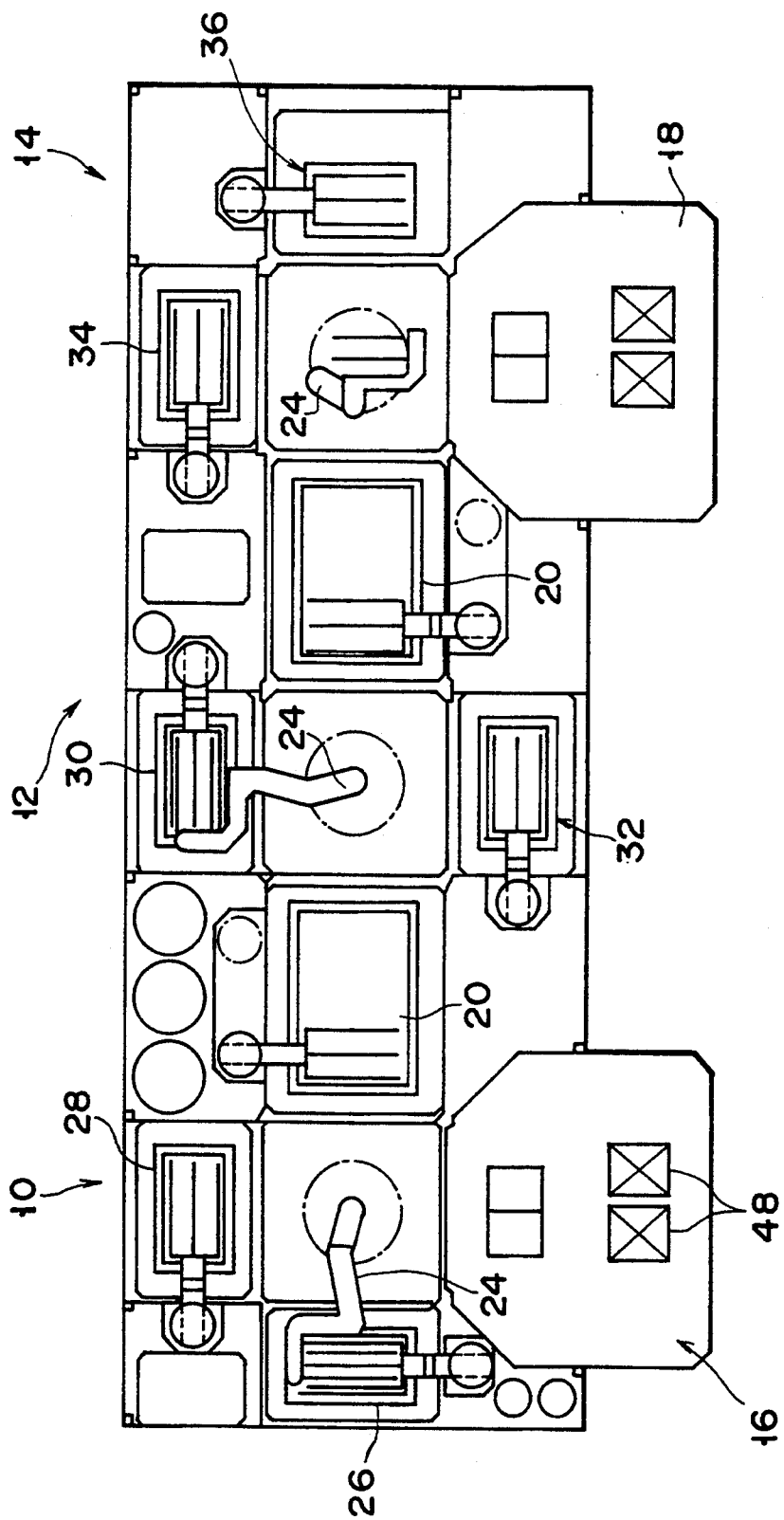
FIG. 1 is a plan view showing an overall structure of an embodiment of the present invention, in which a transfer apparatus according to the invention has been applied to a washing apparatus in a semiconductor wafer manufacturing apparatus.

FIG. 1 shows a semiconductor wafer washing apparatus according to an embodiment of the invention. The apparatus comprises three washing treatment units 10, 12 and 14. The wafer-receiving side treatment unit 10 is coupled to a loader 16 serving as a carrier table, and the wafer-discharge side treatment unit 14 is coupled to an unloader 18 serving as a carrier table. Underwater loaders 20 included in any of the three units are provided, respectively, between the washing treatment units 10 and 12 and between the treatment units 12 and 14.

The unit 10 is constructed such that a rotary transfer arm 24 for transferring semiconductor wafers 22 is situated at a center part of the unit 10. In addition, two washing treatment baths 26 and 28 are arranged around the arm 24; bath 28 being on the front side of the loader 16, and bath 26 being on the left of the arm 24. In the present embodiment, the washing treatment bath 26 is employed as a chemical treatment bath for ammonia treatment, and the bath 28 is employed as a quick-damp-rinse (QDR) treatment bath for water-rinse treatment.

The intermediate washing treatment unit 12 has a rotary transfer arm 24 at its center area. The underwater loaders 20 are situated on the right and left sides of the arm 24, and two washing treatment baths 30 and 32 are arranged in front of and in rear of the arm 24. In the present embodiment, the washing treatment bath 30 is employed as a chemical treatment bath for hydrofluoric acid, and the bath 32 is employed as a water rinse over-flow treatment bath.

The discharge-side washing treatment unit 14 has a rotary transfer arm 24 at its center area. A washing treatment bath 34 is situated on the front side of the unloader 18, and a dry treatment bath 36 is provided on the right side of the arm 24. In this embodiment, the treatment bath 34 is employed as a final water rinse bath.

Figure 8:
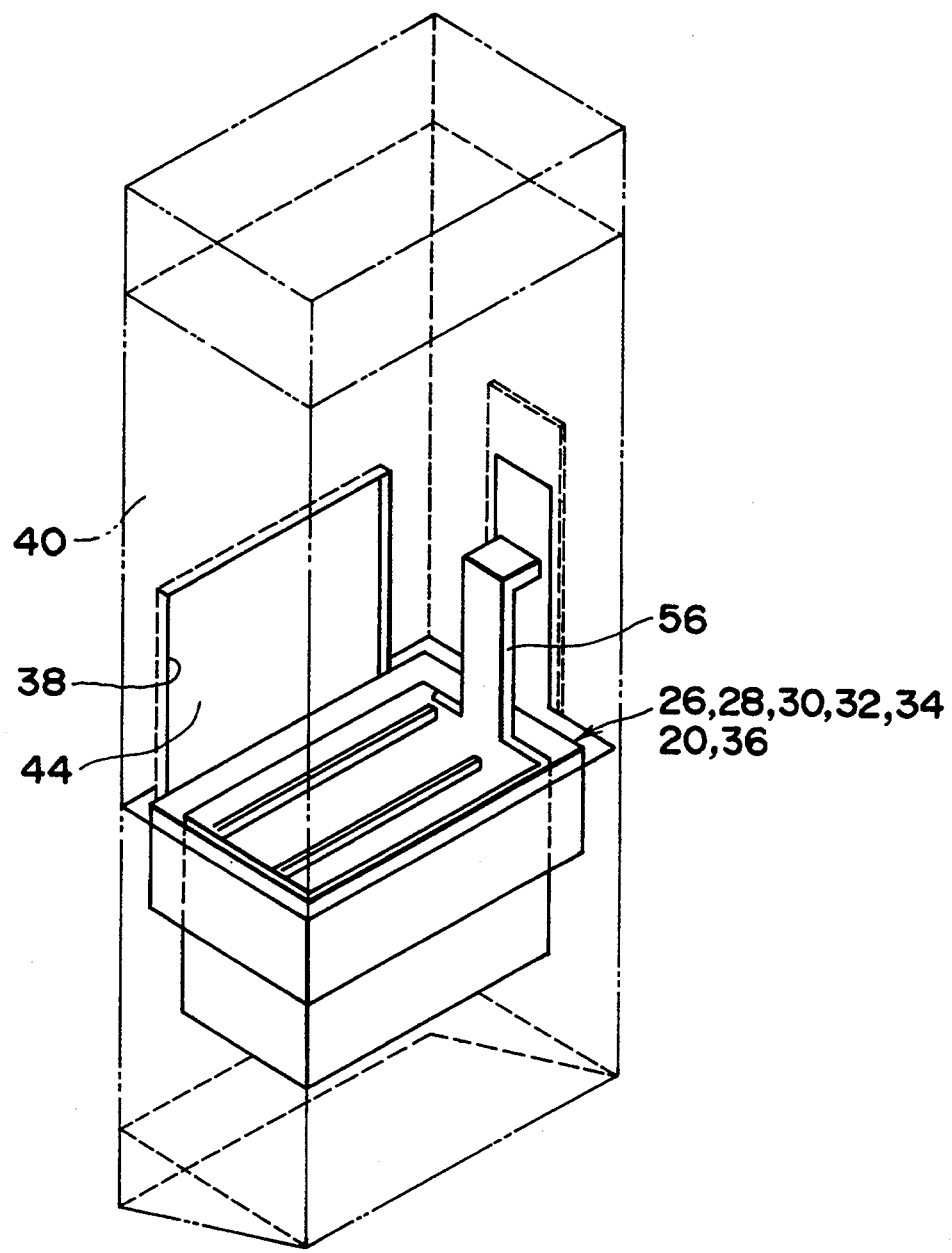
FIG. 8 is a perspective view showing the state of a washing treatment bath.

The washing treatment baths 26, 28, 30, 32 and 34, the underloaders 20 and the dry treatment bath 36 are housed in a casing 40, as shown in FIG. 8. The casing 40 has an opening 38 for receiving/discharging semiconductor wafers 22.

Figure 2:
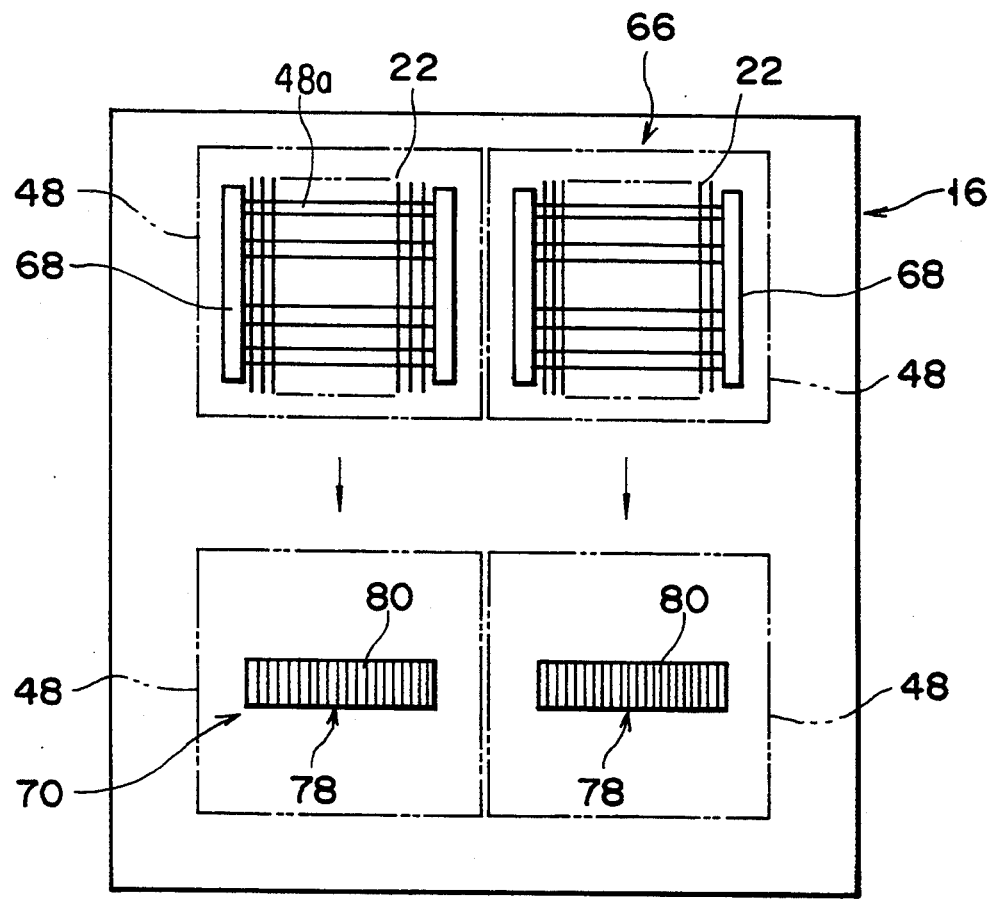
FIG. 2 is a plan view showing a semiconductor wafer transfer apparatus in a loader section shown in FIG. 1.

As is shown in FIG. 2, a semiconductor wafer transfer apparatus 66 is provided on the loader 16.

The transfer apparatus 66 comprises a plurality of (two in this embodiment) carriers 48, orientation-flat ("ori-fla") aligning mechanisms 68, a push-up mechanism 70 and the above-mentioned rotary transfer arm 24.

Each of the two carriers 48 comprises a frame member having four rod members 48a. The rod members 48a are distanced in parallel to each other so as to support lower portions of the semiconductor wafers 22 which are in the erected state. A plurality of (e.g. 25) semiconductor wafers 22 are placed equidistantly on each carrier 48. The wafers 22 are conveyed from the prior-stage device onto the loader 16 in units of two. The two carriers 48 are arranged on the loader 16 with a slight distance therebetween to prevent their mutual contact.

Figure 3:
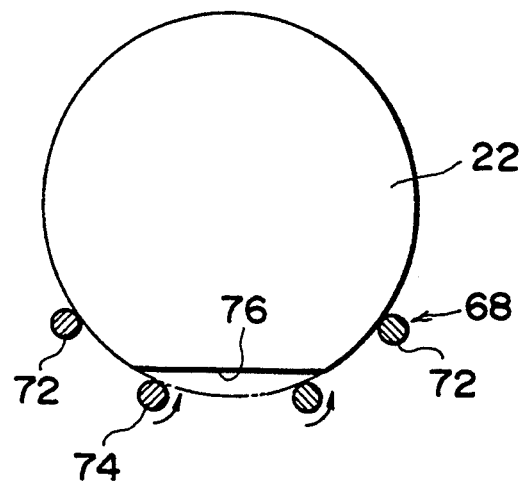
FIG. 3 is an orientation-flat aligning mechanism shown in FIG. 2.

Two ori-fla aligning mechanisms 68 are provided to correspond to the two carriers 48. As is shown in FIG. 3, each ori-fla aligning mechanism 68 comprises two upper guide rods 72, which are in contact with the peripheral surfaces of wafers 22, and two lower rotary shafts 74. The lower parts of the 25 semiconductor wafers 22 on each carrier 48 are brought into contact with the guide rods 72 and rotary shafts 74, and the rotary shafts 74 are rotated for a predetermined time period. When orientation-flats 76 of the wafers 22 are situated at the lower position, they become out of contact with the rotary shafts 74. In this position, the wafers 22 are aligned.

The push-up mechanism 70 pushes up and supports the semiconductor wafers 22 on the two carriers 48 from the inside of the carriers 48 through a bottom opening of the carriers 48. The push-up mechanism 70 gathers the wafers 22. The push-up mechanism 70 comprises two push-up rods 78 associated with the carriers 48, and a driving mechanism (not shown) for moving the push-up rods 78 vertically and horizontally.

Figure 4A:
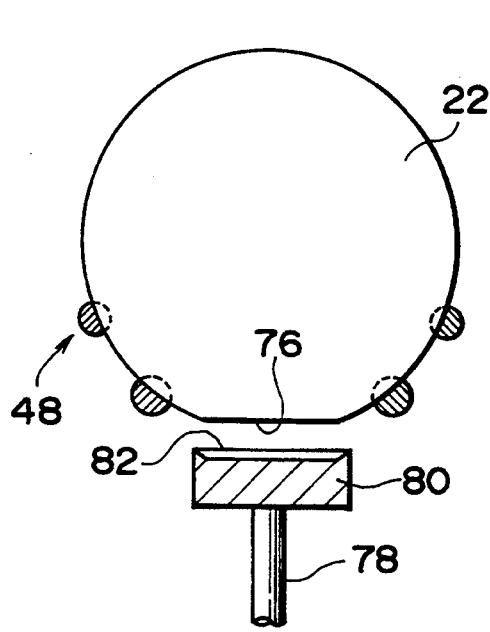
FIGS. 4A and 4B are cross-sectional views showing the state of operation of a push-up mechanism shown in FIG. 2.
Figure 4B:
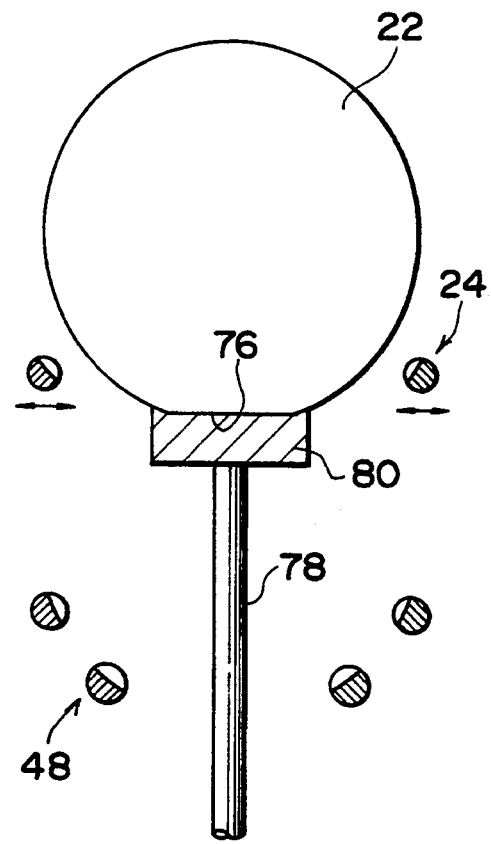

Each push-up rod 78 has a push-up member 80 with a length slightly greater than the length of the 25 semiconductor wafers 22 along the axis along which the wafers 22 are arranged equidistantly on the corresponding carrier 48. Twenty-five (25) semiconductor wafer support grooves 82 for receiving and supporting the lower end portions of the wafers 22 on the carrier 48 are formed equidistantly in the upper surface of the push-up member 80 (see FIG. 4A or FIG. 5). As is shown in FIG. 5, each semiconductor wafer support groove 82 has a support portion 84 corresponding to the thickness of each semiconductor wafer 22, and a flared insertion guide portion 86 is formed at an upper part of the support portion 84. Thereby, the semiconductor wafers 22 can smoothly be inserted in the grooves 82.

The push-up member 80 is designed such that a distance t1 between an adjoining end portion 88 of the push-up member 80 and a surface of the semiconductor wafer 22 situated in the support portion 84 near the end portion 88 is half the distance t2 between the adjacent semiconductor wafers 22. Thereby, when the push-up rods 78 are approached to each other to gather the semiconductor wafers 22, the distance between the semiconductor wafers 22 situated at the adjoining end portions of the two push-up members 80 coincides with the distance t2 between other adjacent wafers 22. Thus, all semiconductor wafers 22 can be arranged equidistantly.

Alternatively, as shown in FIG. 6, the adjoining end portions 88 of the two push-up members 80 are provided with ridges and grooves 90 and 92 which are meshed with one another, thereby reinforcing the end portions 88.

The unloader 18 has substantially the same mechanism as the loader 16. The semiconductor wafers 22 are returned by the unloader 18 to the carriers 48 in a reverse order.

Figure 7:
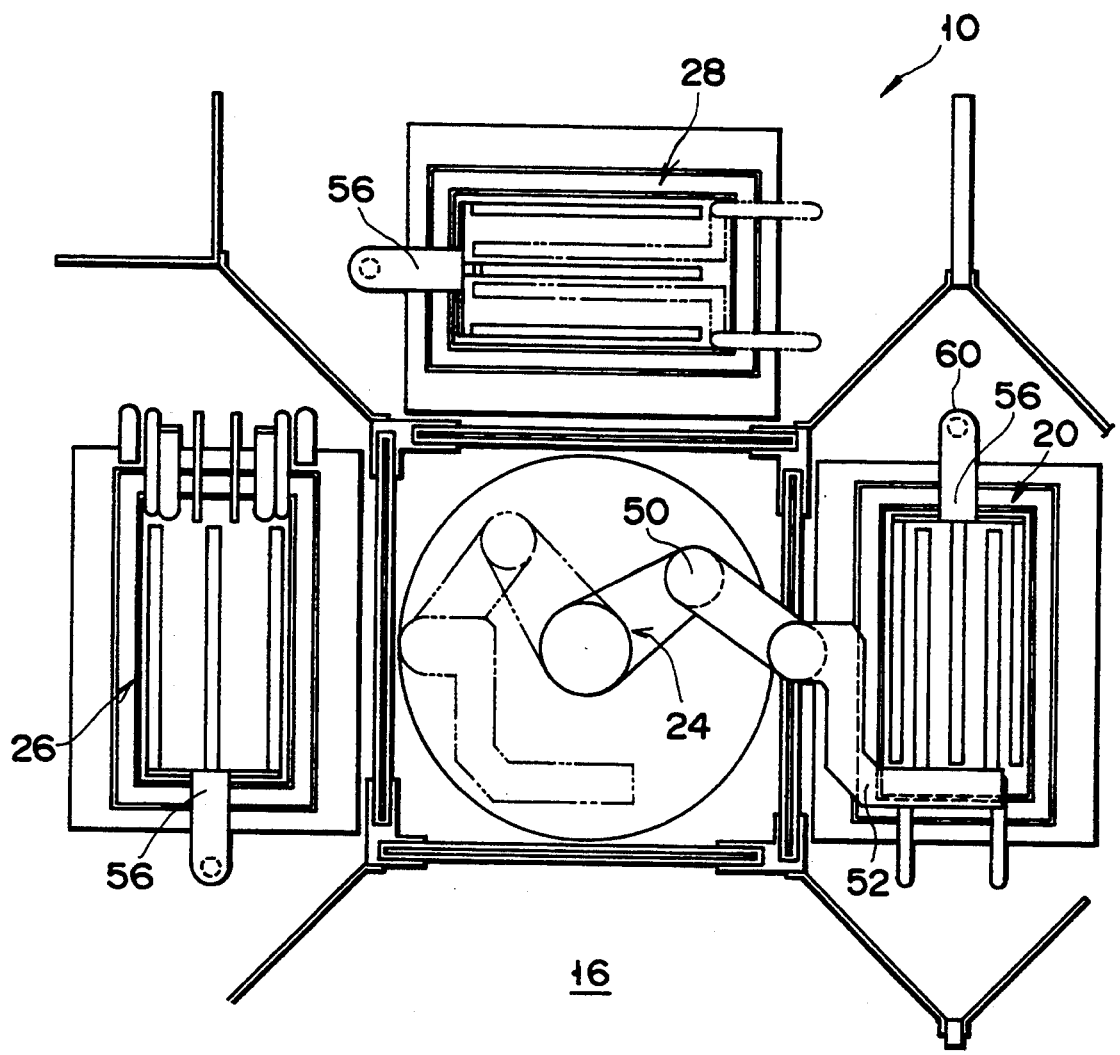
FIG. 7 is an enlarged view showing a washing treatment unit on the wafer-receiving side in FIG. 1.
Figure 10A:
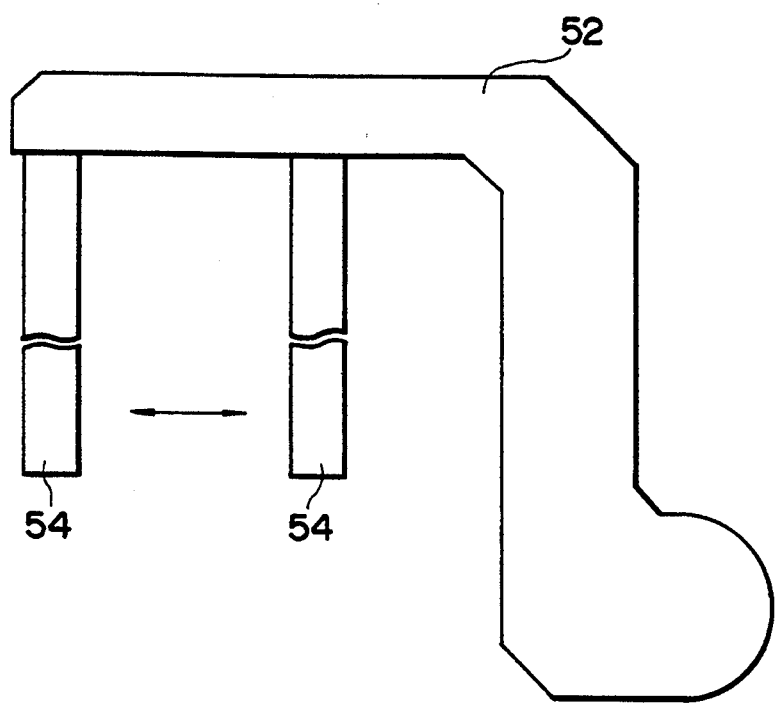
FIG. 10A is a plan view of a wafer fork.
Figure 10C:
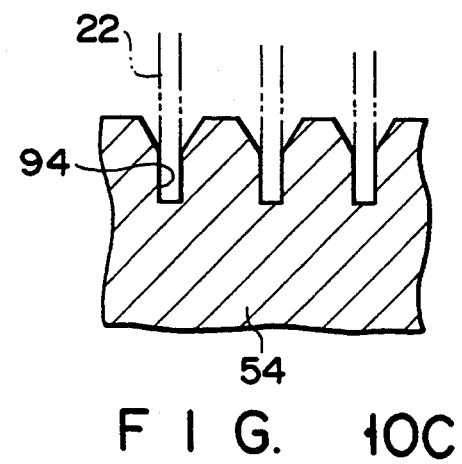
FIG. 10C is a cross-sectional view taken along line A—A in FIG. 10B.
Figure 10B:
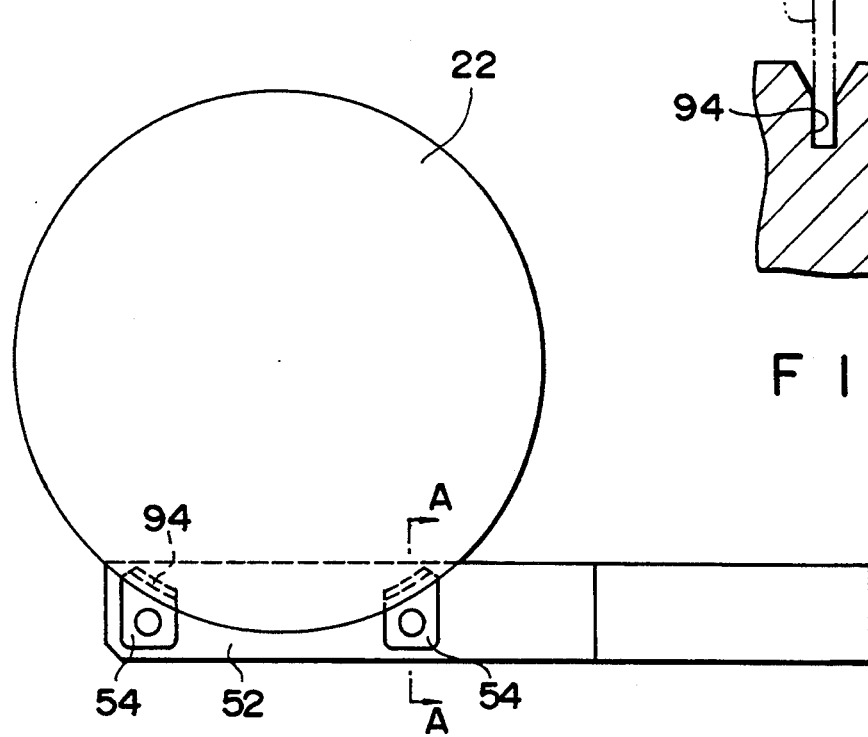
FIG. 10B is a side view thereof.

As is shown in FIG. 7, the rotary transfer arm 24 supports 50 semiconductor wafers 22 supported on the push-up rods 78 of the push-up mechanism 70 by lifting the wafers 22 from the lower side thereof. Then, the wafers 22 are transferred to a desired position. The arm 24 comprises an extendible multi-Joint arm body 50 and a wafer fork 52 for supporting the wafers 22. The wafer fork 52 has two parallel support arms 54, as shown in FIGS. 10A and 10C. The arms 54 are horizontally movable. Each arm 54 has equidistant 50 support grooves 94 for aligning semiconductor wafers 22. While the support arms 54 are moved away from each other, the arms 54 are situated under the push-up rods 78 supporting the semiconductor wafers 22. The distance between the support arms 54 is narrowed and the push-up rods 78 are lowered. Thereby, 50 wafers 22 are placed on the arms 54.

Figure 9:
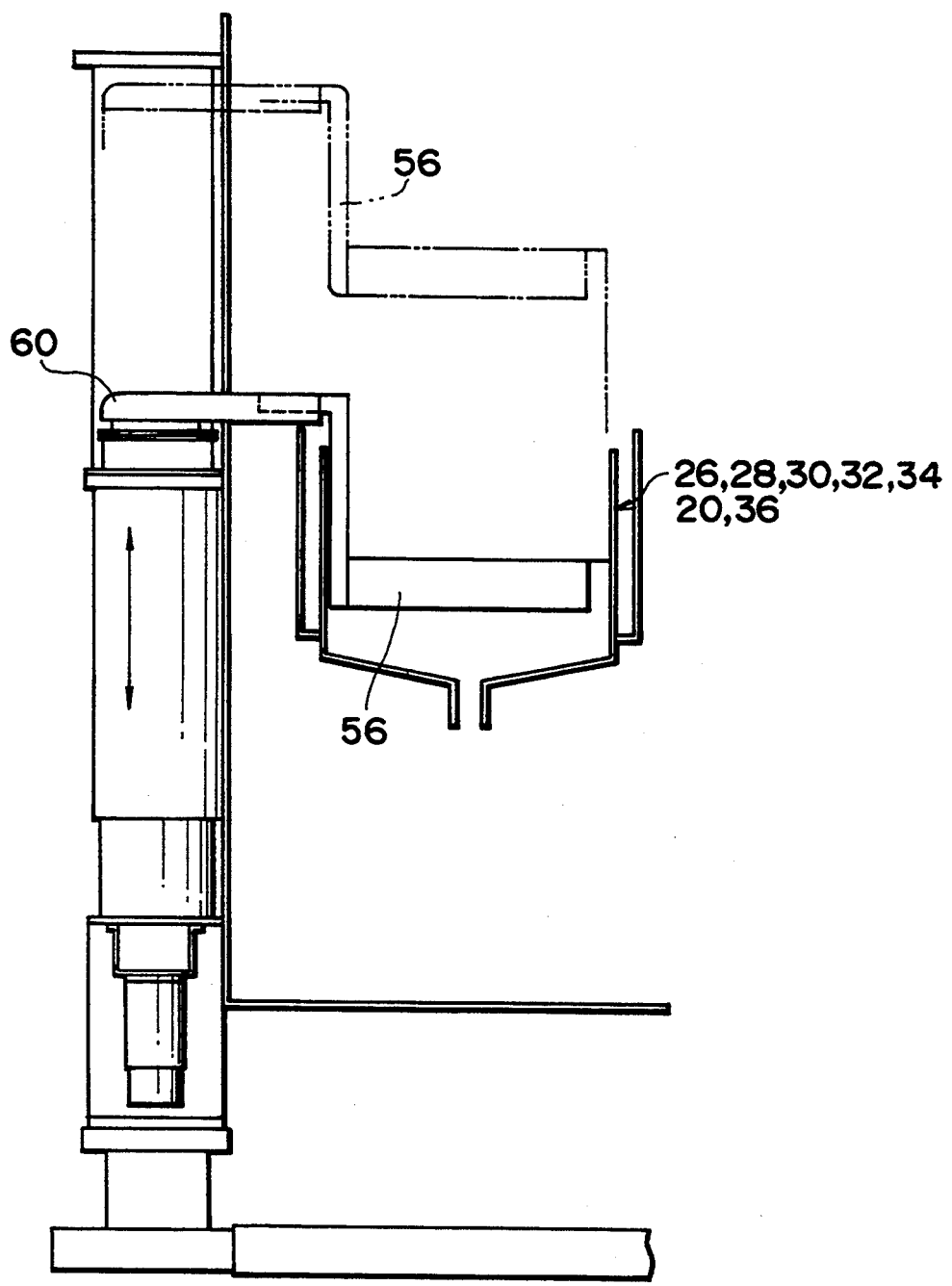
FIG. 9 is a side view showing a boat and an arm.
Figure 11A:
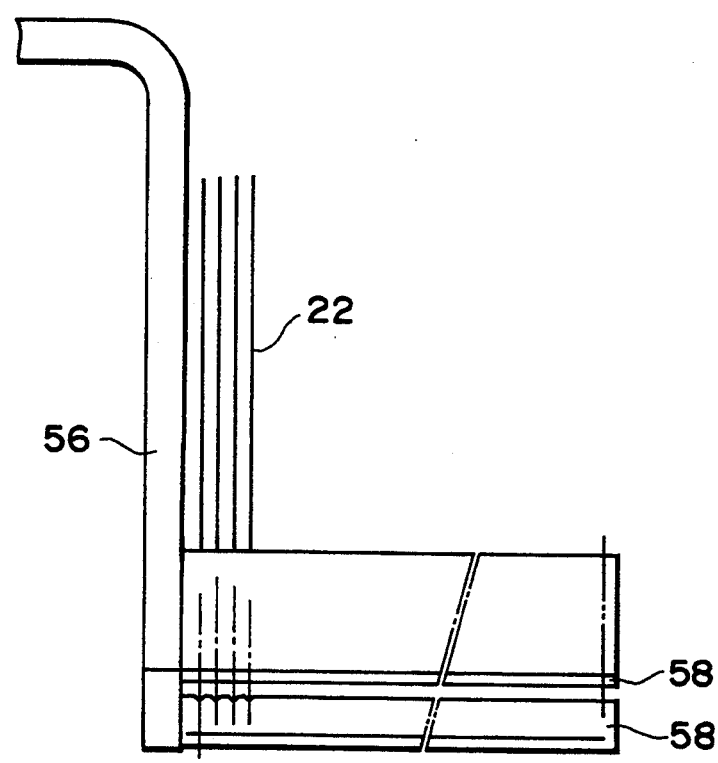
FIG. 11A is a side view of a boat.
Figure 11B:
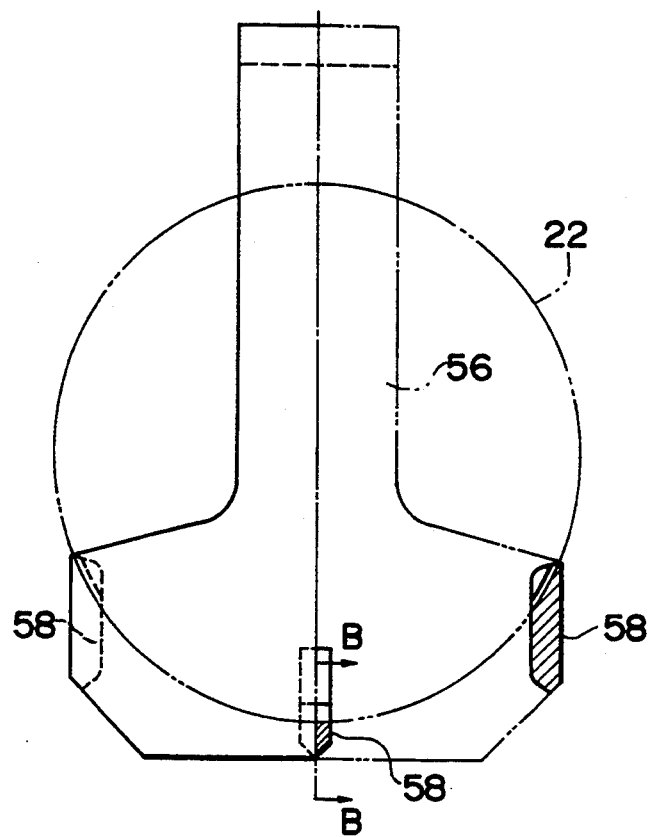
FIG. 11B is a front view thereof.
Figure 11C:
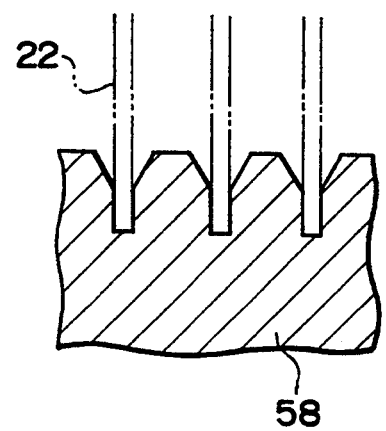
FIG. 11C is a cross-sectional view taken along line B—B in FIG. 11B.

The rotary transfer arm 24 receives semiconductor wafers 22 from the loader 16. In addition, the arm 24 transfers and receives the wafers 22 in association with the washing treatment baths 26, 28, 30, 32 and 34, underwater loaders 20, dry treatment bath 36 and unloader 18. Specifically, in association with the underwater loader 20, washing treatment baths 26, 28, 30, 32 and 34 and dry treatment bath 36, a boat 56 provided for each bath is vertically moved, as shown in FIG. 9, thus enabling the arm 24 to receive the wafers 22 from the boat 56 and transfer the wafers 22 to the boat 56. As is shown in FIGS. 11A to 11C, the boat 56 has a support rod 58 having grooves for supporting the wafers 22. The support rod 58 is designed such that the rod 58 does not interfere with the support arms 54 of the wafer fork 52 when it is vertically moved.

The operation of the present embodiment will now be described.

Two carriers 48, each supporting 25 semiconductor wafers 22, are conveyed to the loader 16. The ori-fla aligning mechanism 68 is operated, as shown in FIG. 3, to align the orientation flats of the wafers 22 in the carriers 48. Thus, the wafers 22 are aligned. In this case, the ori-fla aligning mechanism 68 moves the guide rods 72 and rotary shafts 74 from below the carriers 48, thus bringing the rods 72 and shafts 74 into contact with the wafers 22. Then, by rotating the wafers 22 for a predetermined time period, the oriental-flat alignment is carried out.

The carriers 48 are moved by the loader 16 to a location above the push-up rods 78. The push-up mechanism 70 moves up the push-up rods 78. While the position of the carriers 48 is unchanged, the push-up rods 78 push up and support the semiconductor wafers 22 through the bottom opening of the carriers 48.

Thereafter, the push-up rods 78 are brought into contact with each other by the push-up mechanism 70. Alternatively, only one of the rods 78 moves towards the other, whereby both are brought into contact. Thus, 50 semiconductor wafers 22 are arranged equidistantly. In this case, as shown in FIG. 5, the distance t1 between the adjoining end portion 88 of the push-up member 80 and a surface of the semiconductor wafer 22 situated at the end portion 88 is half the distance t2 between other adjacent semiconductor wafers 22. Alternatively, the end portions 88 of the push-up members 80 are provided with ridges and grooves. When the push-up members 80 are brought into contact with each other, all semiconductor wafers 22 are arranged equidistantly.

In the present embodiment, since the shape of the push-up member 80 is designed, as shown in FIG. 5 or 6, the pitch of the wafers 22 can be made constant after the push-up members 80 are brought into contact; however, the pitch is not necessarily be set to be constant. In particular, in the washing treatment, a variance in pitch does not considerably affect the uniformity in treatment. However, in the case where the pitch between wafers considerably affects the uniformity in treatment, e.g. in a plasma CVD process, the structure of FIG. 5 or 6 is desirable.

Subsequently, the rotary transfer arm 24 is rotated horizontally, and the support arms 54 of wafer fork 52, while the distance between arms 54 is widened, are extended towards the push-up rods 78. The wafer fork 52 at the distal end of the arm 24 is situated under the push-up rods 78. The distance between the arms 54 is narrowed. The push-up rods 78 are lowered. As a result, the semiconductor wafers 22 are fitted in the grooves 94 of the support arms 54 and are aligned on the wafer fork 52.

While the wafers 22 are placed on the wafer fork 52, the rotary transfer arm 24 is rotated horizontally and the wafers 22 are situated above the washing treatment bath 26. In this state, the wafers 22 are fitted in the grooves of the support rod 58 and are aligned on the boat 56 of the bath 26. Then, the washing treatment is started.

After the washing treatment, the semiconductor wafers 22 on the boat 56 are brought onto the support arms 54 of the wafer fork 52 of rotary transfer arm 24 according to the process reverse to the above. The wafers 22 are taken out of the casing 40 of the bath 26. The wafers 22 are transferred to the next washing treatment bath 28.

After the washing treatment in the wafer-receiving side washing treatment unit 10 is finished, the wafers 22 are brought to the intermediate washing treatment unit 12 via the underwater loader 20. Further, the wafers 22 are transferred to the discharge-side washing treatment unit 14 via the washing treatment units 30 and 32 and underwater loader 56. Then, the wafers 22 are transferred to the unloader 18 via the washing treatment bath 34 and dry treatment bath 36. By performing the same operations as in the case of the loader 16 in the reverse order, the 50 wafers 22 are divided into two units of 25 wafers, and the orientation-flat alignment is carried out. The two units of wafers 22 are placed on the two carries 48 and are conveyed out.

In the above embodiment, the three treatment units 10, 12 and 14 are combined; however, the number of units combined is freely chosen.

The number of semiconductor wafers 22 supported on one carrier is not limited to 25.

In the above embodiment, the semiconductor wafers 22 of two carriers are transferred at a time; however, it is obvious that the semiconductor wafers of three or more carriers can be transferred at a time.

FIG. 12 shows another embodiment of the present invention. The main difference between the preceding embodiment and this embodiment is as follows. In the preceding embodiment the semiconductor wafers 22 are directly lifted by the support arms 54 of the rotary positioning arm 24 from the push-up members 80 and then the wafers 22 are transferred to the treatment device. By contrast, in this embodiment the semiconductor wafers 22 are temporarily lifted from the push-up members 80 by vertically movable support means provided on one of the loader 16 and unloader 18, and the wafers 22 are taken from the support means by the rotary positioning arm 24 and brought to the treatment device.

The common parts between these embodiments are denoted by like reference numerals, and a detailed description thereof is omitted.

The support means 100, which is provided vertically movably on one of loader 16 and unloader 18, as mentioned above, comprises mainly an elevator 102 which can be vertically moved by drive means (not shown) within a box 101, and a pair of support arms 103a and 103b having grooves. The support arms 103a and 103b extend from a top portion 102a of the elevator 102 in parallel to the push-up members 80.

The support arms 103a and 103b are moved towards and away from each other in the directions indicated by a double-headed arrow a by means of a motor (not shown) provided in the top portion 102a of the elevator 102. One support arm 103a has at its end an optical sensor constituted by light emitting means 104a and light receiving means 104b. The optical sensor detects whether semiconductor sensors 22 are received by the support arms 103a and 103b.

The support arms 103a and 103b are exposed to a chemical atmosphere; thus, it is desirable that the arms 103a and 103b be made of a material having a high resistance to chemicals, causing no damage to semiconductor wafers 22, and having a low frictional coefficient: for example, fluorine-contained resin such as Teflon, or polyether-ether-keton.

The operation of this embodiment will now be described.

As in the first embodiment, two carriers 48, each supporting 25 semiconductor wafers 22, are conveyed onto the loader 16. Oriental-flat alignment is carried out by the ori-fla aligning mechanism 68. The carriers 48 are moved to a location above the push-up members 80 by the loader 16. The push-up rods 78 rise and enable the push-up members 80 to lift and support the semiconductor wafers 22 within the carriers 48 through the bottom openings of the carriers 48.

Subsequently, as in the first embodiment, the push-up rods 78 approach each other and their ends are abutted on each other. Thus, the 50 semiconductor wafers 22 are arranged equidistantly.

while the support arms 103a and 103b with grooves are distanced suitably, they are lowered and situated near both sides of the push-up members 80. The support arms 103a and 103b are moved toward each other and brought into contact with the lower side portions of the wafers 22. Then, the push-up rods 78 are lowered, and the wafers 22 are supported by the support arms 103a and 103b.

A wafer fork 52 of the rotary positioning arm 24, which has a pair of fixed support arms 54a, is guided under the support arms 103a and 103b. The wafer fork 52 is elevated, and the semiconductor wafers 22 supported by the support arms 103a and 103b are supported, in turn, by the wafer fork 52 of the rotary positioning arm 24.

As in the first embodiment, while the semiconductor wafers 22 of the two carriers are supported on the wafer fork 52, the rotary positioning arm 24 rotates horizontally and the wafers 22 are transferred to the washing treatment bath 26, etc.

It is desirable that the support arms 54, 54a of the wafer fork 52, like the support arms 103a and 103b, be made of a material having a high resistance to chemicals, causing no damage to semiconductor wafers 22, and having a low frictional coefficient: for example, fluorine-contained resin such as Teflon, or polyether-ether-keton.

As has been described above, according to the transfer apparatus of the present invention, a number of objects supported on a plurality of carriers are pushed up to the upper part of the carriers by means of the push-up members of the push-up mechanism. In this state, the distance between the push-up members is narrowed, and the objects of the carriers are transferred to another container. Thus, the objects supported on a plurality of carriers can be transferred simultaneously. In this case, the pitch of the objects located at the mutually facing end portions of the carriers can be made closer to, or equal to, the pitch of other adjacent objects. Even in the case where the uniformity of the distance between objects affects the treatment quality, the present invention can be applied.

In addition, the distance between the adjoining end portion of each push-up member and the object situated at the adjoining end portion is set to be half the distance between other adjacent objects, all the objects can be arranged equidistantly.

Furthermore, the mutually adjoining end portions of push-up members are provided with ridges and grooves which are to be intermeshed. When the ridges and grooves of the adjoining end portions are intermeshed, the distance between the objects situated at the end portions is set to be equal to the distance between other adjacent objects. Thereby, while the distance between the objects situated at the end portions can be made equal to the distance between other adjacent objects, the adjoining end portions of the push-up members can be reinforced.

Additional advantages and modifications will readily occur to those skilled in the art. Therefore, the invention in its broader aspects is not limited to the specific details, and representative devices, shown and described herein. Accordingly, various modifications may be without departing from the spirit or scope of the general inventive concept as defined by the appended claims and their equivalents.

What is claimed is:

1. A transfer apparatus for transferring a plurality of objects between a carrier constituted by a frame for supporting the objects equidistantly and a support member, said transfer apparatus comprising:

a carrier table for arranging a plurality of said carriers linearly along longitudinal axes of said carriers;

a plurality of push-up members, each of said push-up members being adapted to be moved below each of said carriers for pushing up said objects supported on the carriers through a lower opening portion of each of said carriers, each of said push-up members having an upper surface with a plurality of equidistantly spaced grooves for receiving and lifting all of the objects supported in one carrier as a whole; and a drive means for moving the push-up members towards each other so as to be adjacent to each other and thereby adjust a space between endmost objects on adjacent push-up members which face each other and are respectively supported on endmost grooves of each of the adjacent push-up members to become the same as a space between objects supported on one push-up member;

wherein all the objects, which have been lifted by the push-up members and equidistantly spaced to one another, are transferred to said support member at a time.

2. The apparatus according to claim 1, wherein the grooves of each of said push-up members are positioned such that a distance between an adjoining end portion of the push-up member and an endmost object located at a groove at said adjoining end portion is half a distance between each adjacent object supported on the grooves of one push-up member.

3. The apparatus according to claim 1, wherein mutually adjoining end portions of the push-up members are provided with ridges and grooves, which are to be intermeshed, and when the ridges and grooves of the adjoining end portions of the push-up members are intermeshed, a distance between the objects situated in grooves at the end portions is equal to a distance between adjacent objects supported on the grooves of one push-up member.

4. The apparatus according to claim 1, wherein said objects are semiconductor wafers.

5. The apparatus according to claim 1, further comprising a rotary transfer arm mechanism having a pair of support arms for supporting and receiving, from a lower side, the objects of the carriers lifted by the push-up members, and means for transferring the objects to said support member.

6. The apparatus according to claim 5, wherein the transfer arm mechanism comprises means for moving the support arms of the rotary transfer arm mechanism towards each other.

7. The apparatus according to claim 5, wherein the support arms of the rotary transfer arm mechanism are fixed at a predetermined distance.

8. A transfer apparatus for transferring a plurality of objects between a carrier constituted by a frame for supporting the objects equidistantly and a support member, said transfer apparatus comprising:

a carrier table for arranging a plurality of said carriers, linearly along longitudinal axes of said carriers, each carrier being constituted by a frame supporting the objects equidistantly;

a plurality of push-up members for pushing up said objects supported on the carriers, and supporting the objects equidistantly at an upper part of each carrier;

rotary transfer arm mechanism having a pair of support arms distanced in parallel, for supporting and receiving, from a lower side, the objects of the carriers lifted by the push-up members, and means for transferring the objects to said support members; and a drive means for moving the push-up members towards each other so as to be adjacent to each other and thereby adjust a space between endmost objects on adjacent push-up members which face each other and are respectively supported on endmost grooves of each of the adjacent push-up members to become the same as a space between objects supported on one push-up member;

wherein all the objects, which have been lifted by the push-up members and equidistantly spaced to one another, are transferred to said support member at a time.

9. The apparatus according to claim 8, wherein the rotary transfer mechanism comprises means for moving the support arms of the rotary transfer arm mechanism toward each other.

10. The apparatus according to claim 8, wherein the support arms of the rotary transfer arm mechanism are fixed at a predetermined distance.

11. The apparatus according to claim 8, wherein said pair of support arms are formed of a chemical-resistant synthetic resin.

12. The apparatus according to claim 11, wherein said synthetic resin is chosen from a group consisting of a fluorine-contained resin and polyether-ether-keton.

13. A transfer apparatus for transferring a plurality of objects between a carrier constituted by a frame for supporting the objects equidistantly and a support member, said transfer apparatus comprising:

a carrier table for arranging a plurality of said carriers, linearly along longitudinal axes of said carriers, each carrier being constituted by a frame supporting the objects equidistantly;

a plurality of push-up members for pushing up said objects supported on the carriers, and supporting the objects at an upper part of each carrier;

support means provided on one side of the carrier table comprising means for vertically moving the support means, the support means having at its upper part of a pair of support arms distanced in parallel, the support means further comprising means for moving the support arms towards each other, thereby receiving and supporting at a time, from a lower side, the objects of said plurality of carriers lifted by said push-up members;

a rotary transfer arm mechanism which is movable to a position below said support means for receiving the objects of the carriers from said support means and comprising means for transferring the objects to said support member; and a drive members for moving the push-up members towards each other so as to be adjacent to each other and thereby adjust a space between endmost objects on adjacent push-up members which face each other and are respectively supported on endmost grooves of each of the adjacent push-up members to become the same as a space between objects supported on one push-up member;

wherein all the objects, which have been lifted by the push-up members and equidistantly spaced to one another, are transferred to said support member at a time.

14. The apparatus according to claim 13, wherein an optical sensor comprising light emitting means and light receiving means for detecting the presence of the supported objects is provided on at least one of the pair of support arms over an area from a distal end to a proximal end of the one support arm.

15. The apparatus according to claim 13, wherein said pair of support arms are made of a chemical-resistant synthetic resin.

16. The apparatus according to claim 15, wherein said synthetic resin is chosen from a group consisting of a fluorine-contained resin and polyether-ether-keton.

* * * * *